(12) United States Patent
Oh (10) Patent No.: US 6,372,606 B1
(45) Date of Patent: Apr. 16, 2002

(54) METHOD OF FORMING ISOLATION TRENCHES IN A SEMICONDUCTOR DEVICE

(75) Inventor: Yong-Chul Oh, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/368,426

(22) Filed: Aug. 5, 1999

(30) Foreign Application Priority Data

Aug. 7, 1998 (KR) .......................................... 98-32238

(51) Int. Cl.⁷ .............................................. H01L 21/76
(52) U.S. Cl. ...................................... 438/435; 438/424
(58) Field of Search ................................ 438/221, 424, 438/427, 435, 439

(56) References Cited

U.S. PATENT DOCUMENTS

| | | | |
|---|---|---|---|
| 5,258,332 A | * 11/1993 | Horioka et al. | |
| 5,578,518 A | * 11/1996 | Koike et al. | 438/424 |
| 5,674,775 A | * 10/1997 | Ho et al. | 438/424 |
| 5,712,185 A | * 1/1998 | Tsai et al. | 438/424 |
| 5,801,083 A | * 9/1998 | Yu et al. | 438/424 |
| 5,837,612 A | * 11/1998 | Ajuria et al. | 438/697 |
| 5,891,787 A | * 6/1999 | Gardner et al. | 438/424 |
| 6,001,706 A | * 12/1999 | Tan et al. | 438/424 |
| 6,027,982 A | * 2/2000 | Peidous et al. | 438/424 |
| 6,074,932 A | * 6/2000 | Wu | 438/424 |
| 6,090,684 A | * 7/2000 | Ishitsuka et al. | 438/424 |
| 6,103,635 A | * 8/2000 | Chau et al. | 438/424 |

FOREIGN PATENT DOCUMENTS

| | | | | |
|---|---|---|---|---|
| DE | 3829015 A1 | * | 6/1989 | H01L/21/306 |
| JP | 10-12716 | * | 6/1996 | H01L/21/76 |

* cited by examiner

Primary Examiner—Charles Bowers
Assistant Examiner—David S Blum
(74) Attorney, Agent, or Firm—Jones Volentine, P.L.L.C.

(57) ABSTRACT

A method of forming an isolation trench in a semiconductor substrate includes the steps of sequentially depositing first and second insulating layers over the substrate, subsequently etching the second and first insulating layers to define active and non-active regions according to a patterned masking photoresist layer, excessively etching a part of the thickness of the substrate, removing parts of the first insulating layer by undercutting the sides of the non-active region so as to expose parts of the substrate in the active region, etching the substrate by using the second insulating layer as a trench patterned masking layer to form a trench in which the edges of the exposed parts of the substrate are rounded, depositing a third insulating layer on the bottom and side walls of the trench and the rounded parts of the substrate to repair the parts of the substrate damaged when forming the trench, depositing a fourth insulating layer over the second insulating layer so as to completely fill the trench, etching the fourth and second insulating layers plane until a part of the thickness of the second insulating layer is exposed so as to generate the trench isolation region, and sequentially removing the second and first insulating layers along the sides of the isolation trench.

10 Claims, 7 Drawing Sheets

(Related Art)

METHOD OF FORMING ISOLATION TRENCHES IN A SEMICONDUCTOR DEVICE

This application relies for priority upon Korean Patent Application No. 98-32238, filed on Aug. 7, 1998, the contents of which are herein incorporated by reference in their entirety.

FIELD OF THE INVENTION

The present invention concerns a semiconductor device. More particularly, the present invention relates to a method of forming isolation trenches in a semiconductor device.

BACKGROUND OF THE DISCLOSURE

Isolation technology is very important to electrically isolate the elements fabricated in a highly integrated semiconductor device. The local oxidation of silicon (LOCOS) method presently used in the fabrication of 256M bit DRAMs has often shows such drawbacks as the formation of a bird's beak phenomenon that causes flaws in the active openings, the reduction of a subsequent process margin owing to a reduced field oxide layer, imperfect electrical isolation owing to the reduced isolation distance between the elements, etc. All of these drawbacks can result in poor electrical characteristics for the memory device.

One alternative is to form the field oxide layer by means of an oxidation process. In this case, the semiconductor substrate is etched to form shallow trenches having a required depth, and the trenches are filled with an oxide layer by means of chemical vapor deposition (CVD). This is called shallow trench isolation technology. FIGS. 1A to 1E illustrate the steps of forming isolation trenches for a parasitic transistor at the top edge portions of an isolation trench.

Figure 1A:
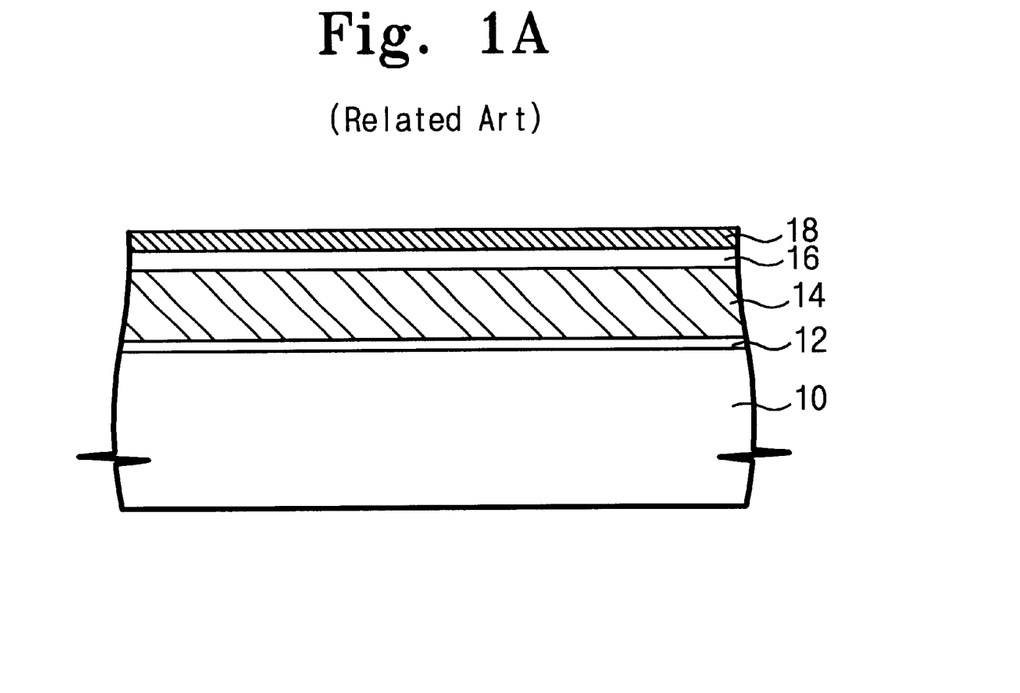
FIGS. 1A to 1E illustrate the steps of forming isolation trenches in a semiconductor substrate, illustrating problems associated with a parasitic transistor at the top edge portions of the isolation trench.

Referring to FIG. 1A, a pad oxide layer 12, a nitride layer 14, a high temperature oxidation (HTO) layer 16, and an anti-reflective coating (ARC) 18 are sequentially deposited over a semiconductor substrate 100. The pad oxide layer 12 is preferably deposited by a thermal oxidation process. The ARC 18 stabilizes the size of the photoresist pattern, securing the process margin.

Figure 1B:
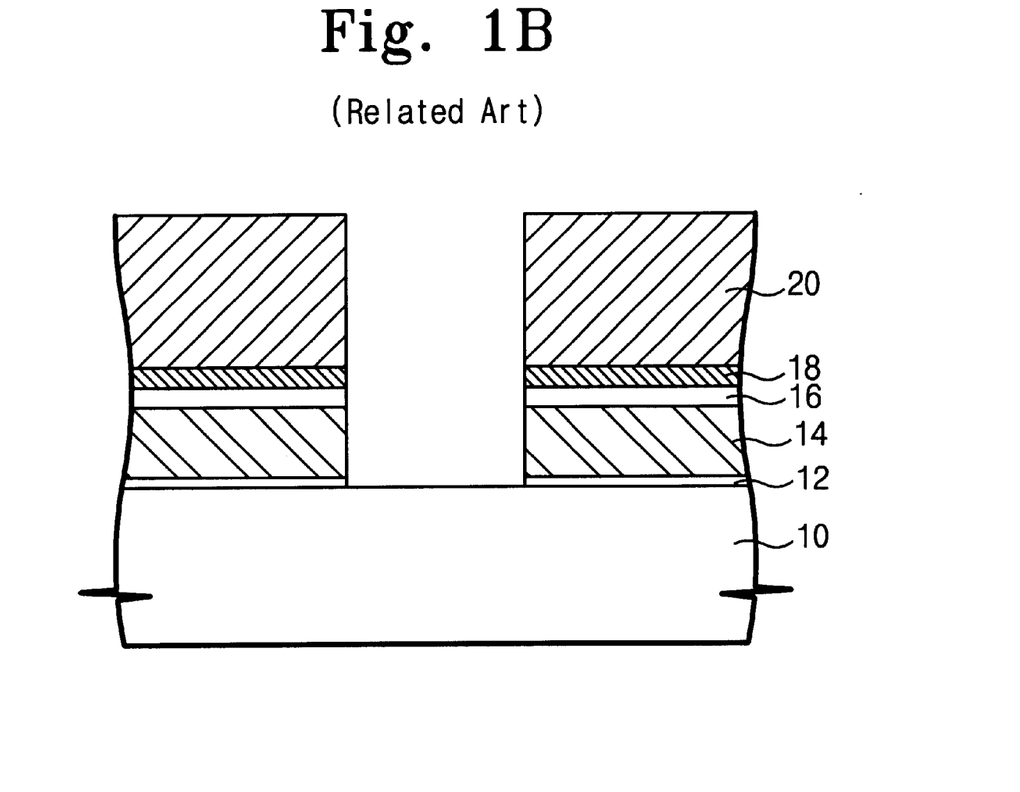

Then, a patterned masking photoresist 20 is formed over the ARC 18 so as to define active and non-active regions, as shown in FIG. 1B. The ARC 18, HTO layer 16, nitride layer 14, and pad oxide layer 12 are sequentially etched by dry etching according to the patterned masking photoresist 20, so as to attain a masking pattern. Removing the photoresist 20 and ARC layer 18, the HTO layer 16 is used as a trench patterned masking layer to dry-etch the trench 22 in the semiconductor substrate 10.

Figure 1C:
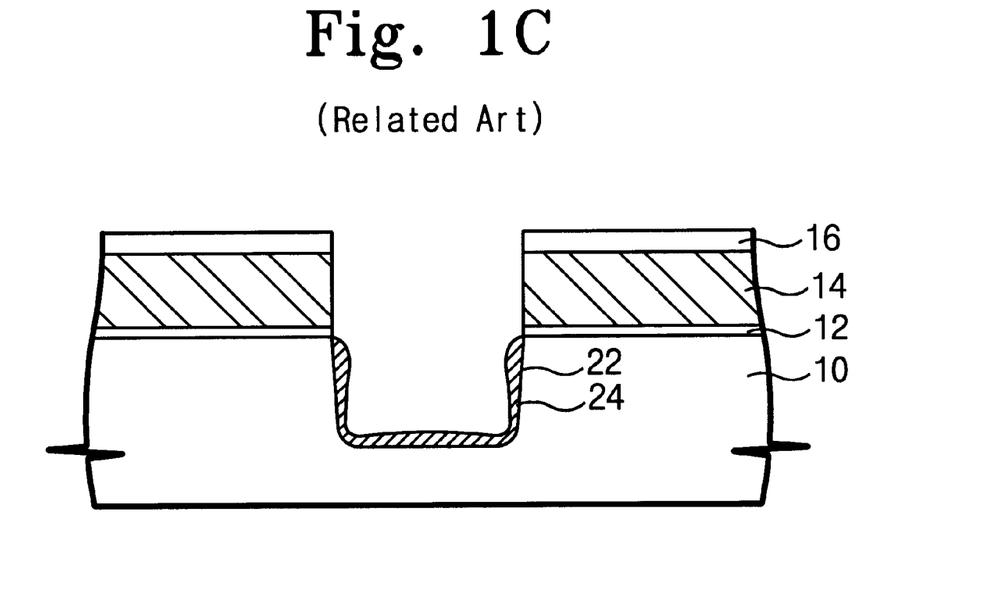

A thermal oxidation layer 24 is deposited over the bottom and side walls of the trench 22 to cure the parts damaged during the etching of the trench 22, as shown in FIG. 1C.

Figure 1D:
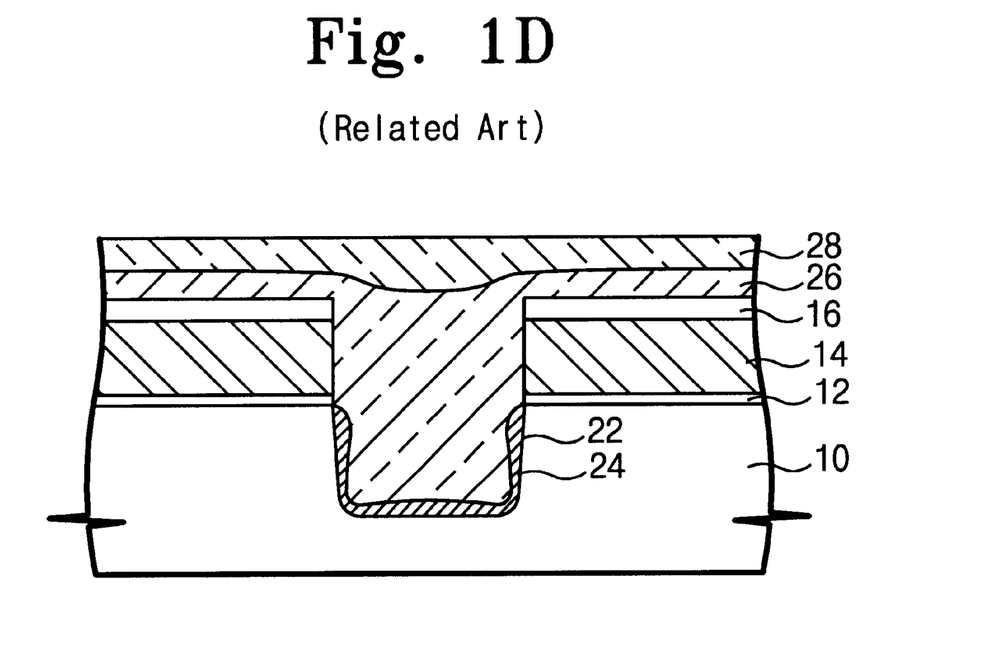

As shown in FIG. 1D, an oxide layer 26 is subsequently deposited over the HTO layer 16 and the trench 22. The oxide layer 26 is preferably formed of an undoped silicon glass (USG) or $O_3$-TEOS (Ozone-Tetraethylorthosilicate), preferably by a plasma CVD process. The oxide layer 26 preferably has a good gap-fill characteristic.

A PE-TEOS (Plasma Enhanced-Tetraethylorthosilicate) layer 28 is deposited over the oxide layer 26. Then, the substrate is annealed at a temperature of preferably more than 900° C. in order to prevent the excessive recessing of the oxide layers 26 and 28 in a subsequent CMP process.

The PE-TEOS layer 28, oxide layer 26, and HTO layer 16 are polished to a plane by means of CMP process until a part of the thickness of the nitride layer 14 is exposed, thus forming an isolation trench.

Figure 1E:
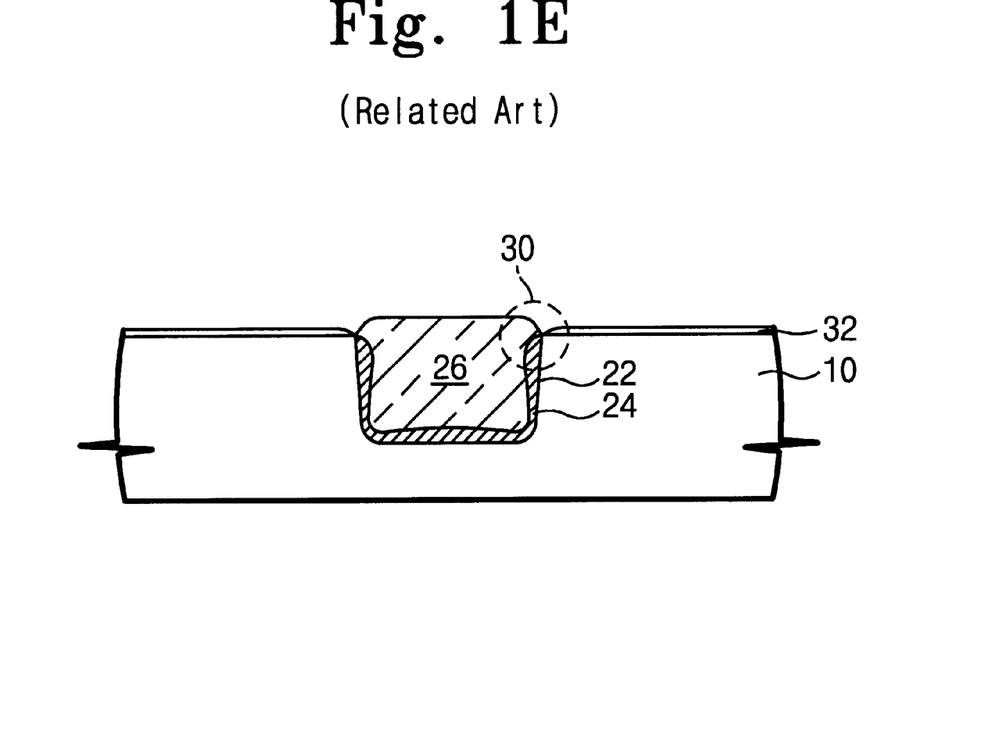
Figure 1E:
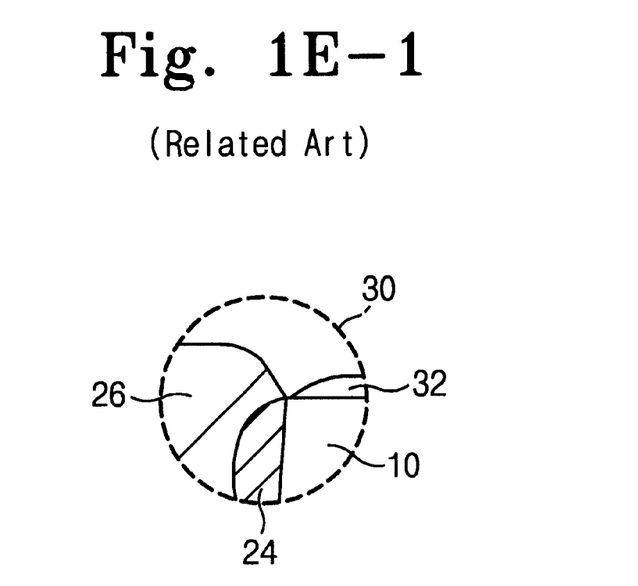

As shown in FIG. 1E, the nitride layer 14 and the pad oxide layer 12 are then sequentially removed from the sides of the trench by dry or wet etching. A masking oxide layer (not shown) is deposited on the sides of the isolation trench in the substrate 10 in order to selectively implant impurity ions into the upper surface of the substrate 10 to produce well regions, field regions, and channel stop regions. The masking oxide layer serves as a buffer to protect the substrate when performing the ion implantation. After removing the masking oxide layer, a thin gate oxide layer 32 is then deposited over the substrate 10 and the insolation trench.

However, in this case, the active region of the substrate 10 at top edges is in contact with the oxide layer 26 of the isolation trench 22, as indicated by reference numeral 30 in FIG. 1E. This acts to generate a parasitic transistor and an electric field from the isolation trench to the active region. This causes drain-induced barrier lowering (DIBL), a reverse narrow-width effect that lowers the threshold voltage of the element, and causes the generation of spurious transistors.

SUMMARY OF THE INVENTION

It is an object of the present invention to provide a method of forming isolation trenches in a semiconductor substrate, while preventing the generation of spurious transistors in the upper edges of the trenches.

The present invention provides isolation trench structures having a rounded profile at top edges so as to suppress parasitic transistor generation. The rounding profile at the top edges of the active region is achieved by undercutting the pad oxide layer during fabrication. Undercutting the pad oxide layer exposes a top surface of the active portion of the substrate. The exposed active substrate is then rounded during the etching of the substrate to form an isolation trench.

More specifically, according to an embodiment of the present invention, a method of forming an isolation trench in a semiconductor substrate, comprises forming a first insulating layer over the substrate, forming a second insulating layer over the first insulating layer, etching the first and second insulating layers to define active and non-active regions according to a patterned masking photoresist layer, etching a first portion of the substrate in the non-active region, undercutting the first insulating layer in the active region to expose second portions of the substrate in the active region, etching the substrate using the second insulating layer as a masking layer to form a trench in which exposed edges of the substrate are rounded, forming a third insulating layer on the bottom and side walls of the trench and over the rounded edges of the substrate, and etching the third insulating layer to expose the second insulating layer. The method may also comprise removing the first and second insulating layers.

The first insulating layer is preferably an oxide layer having a thickness of about 70 Å to 240 Å. The third insulating layers is preferably an oxide layer having a thickness of about 100 Å to 500 Å. The second insulating layer preferably comprises a silicon nitride layer and a high temperature oxidation (HTO) layer, in which the second insulating layer is about 1500 Å thick and the high temperature oxidation layer is about 500 Å thick.

The method may further comprise depositing an anti-reflective coating (ARC) over the second insulating layer. The anti-reflective coating preferably has a thickness of about 600 Å.

The first portion of the substrate is preferably etched to a thickness in the range of about 200 Å to 500 Å. The amount undercut of the first insulating layer is preferably about 100 Å to 300 Å.

The present invention will now described more specifically with reference to the drawings attached only by way of examples.

DETAILED DESCRIPTION OF THE PREFERRED EMBODIMENTS

The present invention will now be described more fully below with reference to the accompanying drawings, in which a preferred embodiment of the invention is shown. This invention may, however, be embodied in different forms and should not be construed as limited to the embodiment set forth below. Rather, this embodiment is provided so that this disclosure will be thorough and complete, and will fully convey the scope of the invention to those skilled in the art.

In the drawings, the thickness of layers and regions are exaggerated for clarity. It will also be understood that when a layer is referred to as being "on" another layer or substrate, it can be directly on the other layer or substrate or intervening layers may also be present. In contrast, when an element is referred to as being "directly on" another element, there are no intervening elements present. Moreover, the described embodiment illustrated herein includes its complementary conductivity type embodiment as well as the conductivity type disclosed.

Figure 2A:
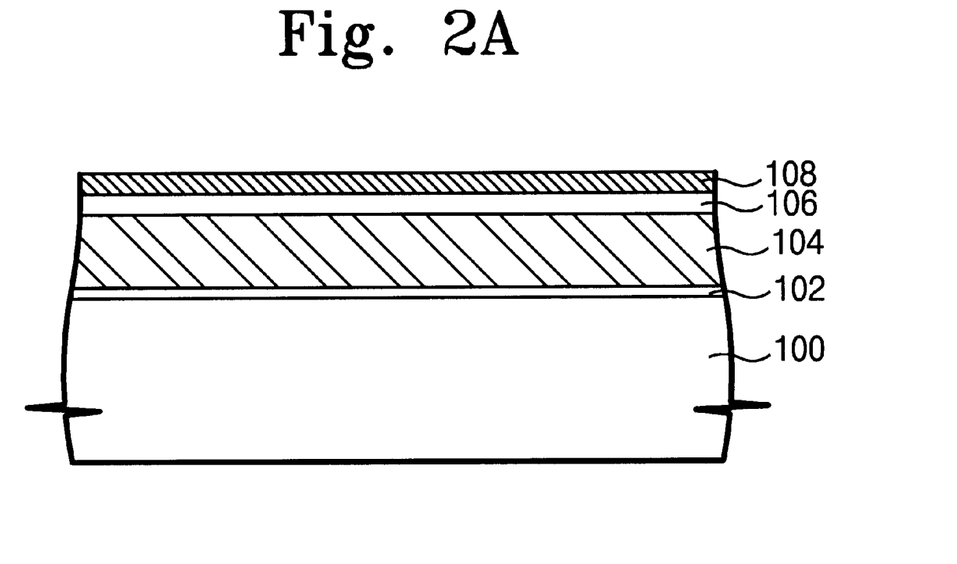
FIGS. 2A to 2G illustrate the steps of forming isolation trenches in a semiconductor substrate according to a preferred embodiment of the present invention.

Referring now to FIG. 2A, a pad oxide layer 102 is deposited over a semiconductor substrate 100, preferably by means of thermal oxidation, to a thickness of about 70 Å to 240 Å. Subsequently a nitride layer 104, an HTO layer 106, and an anti-reflective coating (ARC) 108 are deposited over the pad oxide layer 102. The nitride layer preferably has a thickness of about 1500 Å, and the HTO layer 106 preferably has a thickness of about 500 Å. The ARC 108 is preferably made of SiON with a thickness of about 600 Å. The HTO layer 106 and ARC 108 serve as a mask for the subsequent steps of forming trenches and polishing. The ARC 108 also stabilizes the size of the photoresist pattern during photolithography to secure the desired process margin. The step of forming the HTO layer 106 and ARC 108 may be skipped according to the integration scale of the device manufactured, and the thickness of the nitride 104 may also be adjusted.

Figure 2B:
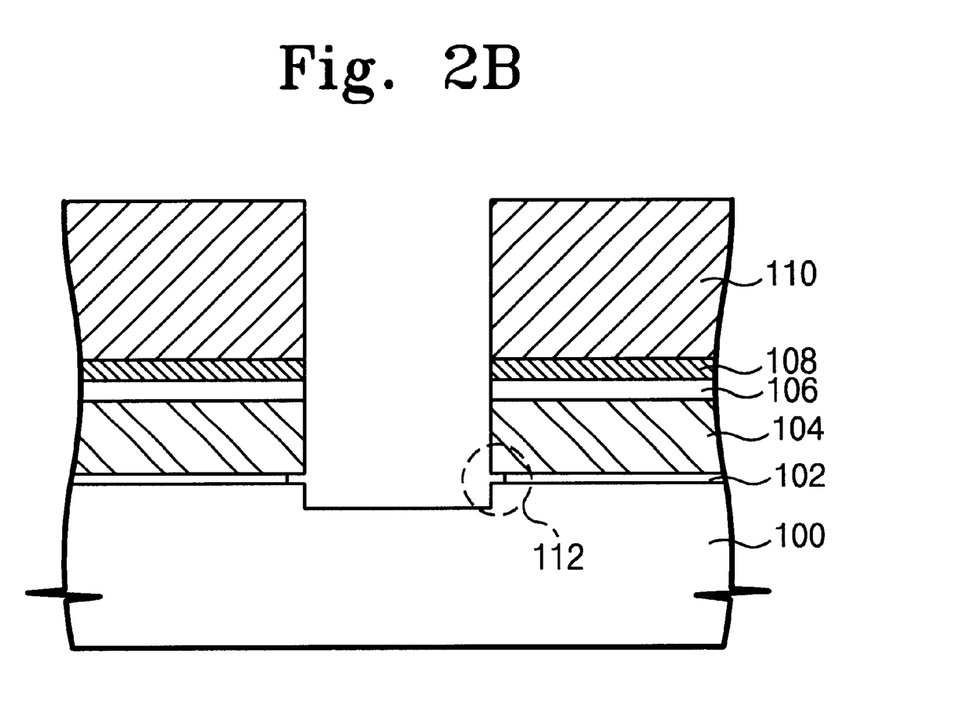

The ARC 108 is coated with a photoresist layer, which is exposed and developed to form a patterned masking photoresist layer 110 that defines active and non-active regions, as shown in FIG. 2B. The ARC 108, HTO layer 106, nitride layer 104, and pad oxide layer 102 are sequentially subjected to dry etching according to the patterned masking photoresist layer 110, thereby generating a patterned masking layer.

In this case, the substrate 100 is over-etched, preferably by a thickness of about 200 Å to 500 Å, to form a depression in the substrate 100. The side walls of the non-active region etched in the substrate 100 are then undercut, preferably by wet etching, to partly remove the first insulating layer 102 so as to expose parts of the substrate 100, as shown by reference numeral 112 in FIG. 2B. The amount of the first insulating layer undercut is preferably about 100 Å to 300 Å.

Figure 2C:
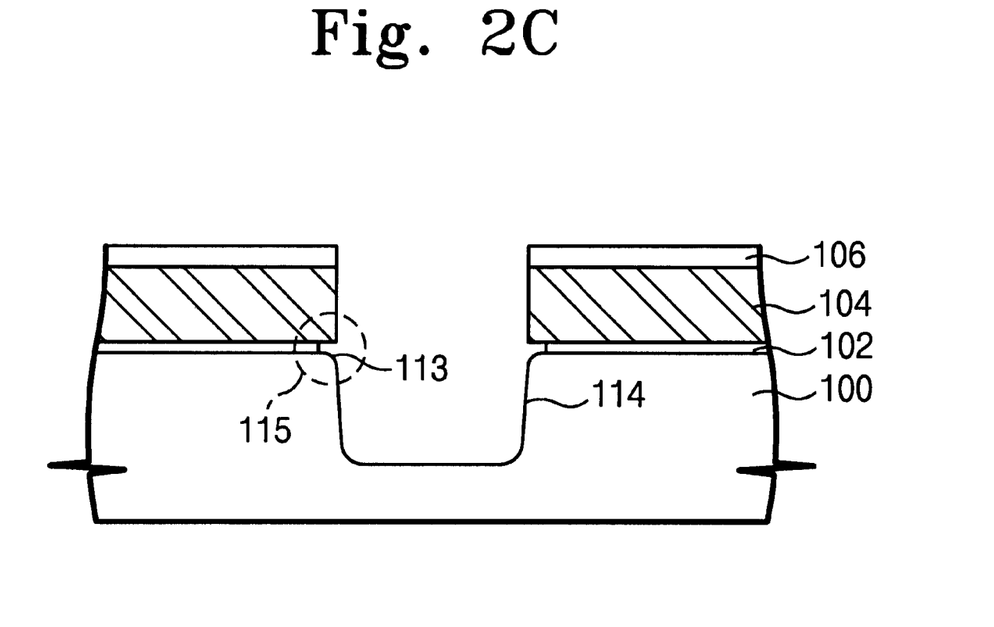
Figure 2C:
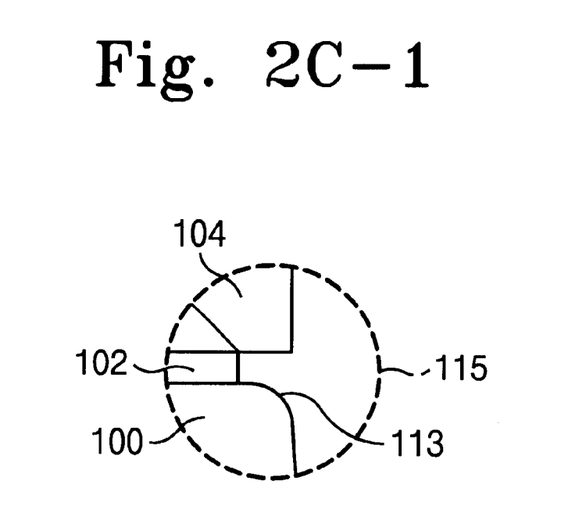

Referring to FIG. 2C, after removing the photoresist layer 110 and ARC 108, the HTO layer 106 is used as a trench pattern masking layer to dry-etch the substrate 100 by a thickness of about 0.1 $\mu$m to 1.5 $\mu$m to thereby generate trenches 114. In this case, the edges 113 of the active region exposed by the previous undercutting (see FIG. 2B) are rounded by the dry etching, as shown by reference numeral 115 in FIG. 2C. The depth of the trench 114 is preferably 0.25 $\mu$m, although this depth may be varied according to circumstances.

Figure 2D:
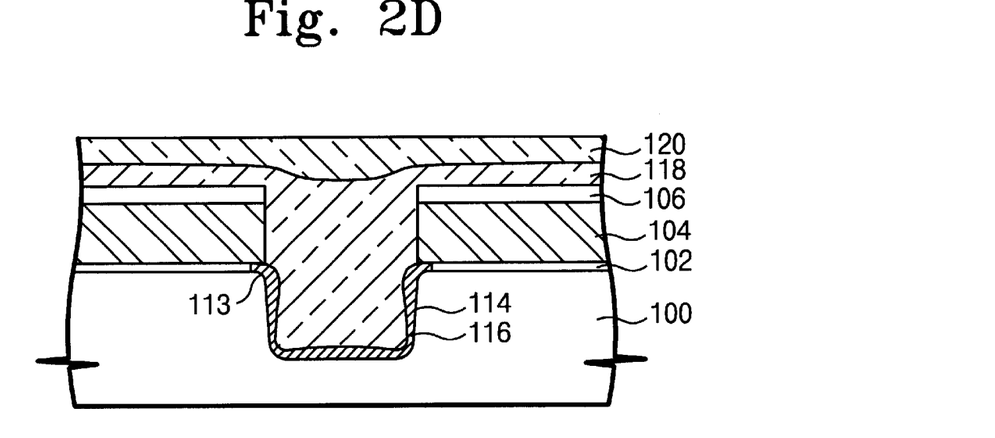

As shown in FIG. 2D, a thermal oxide layer 116 is then deposited on the bottom and side walls of the trench 114 to repair the parts of the substrate 100 damaged when forming the trench 114. The thermal oxide layer 116 also covers the exposed edge regions 115 of the active region, and preferably has a thickness of about 100 Å to 500 Å.

Subsequently an oxide layer 118 is deposited over the HTO layer 106 and in the trench 114. Preferably, the oxide layer 118 is formed by USG or $O_3$-TEOS with a thickness of about 5000 Å, using a plasma CVD method. As a result of its formation parameters, the oxide layer 118 has a good fill characteristic. Thereafter, a PE-TEOS layer 120 is deposited over the oxide layer 118 to a thickness of about 1000 Å. The thickness ratio between the oxide layer 118 and PE-TEOS layer 120 may be adjusted considering the stress of the substrate.

The substrate is then annealed at a high temperature of more than 900° C. in order to prevent an excessive recess of the PE-TEOS layer 120 and the oxide layer 118 in a subsequent chemical-mechanical polishing (CMP) process. The annealing process is preferably performed under either an $N_2$ atmosphere or a wet atmosphere. If a wet atmosphere annealing process is used, it may be performed at a temperature below 850° C.

Figure 2E:
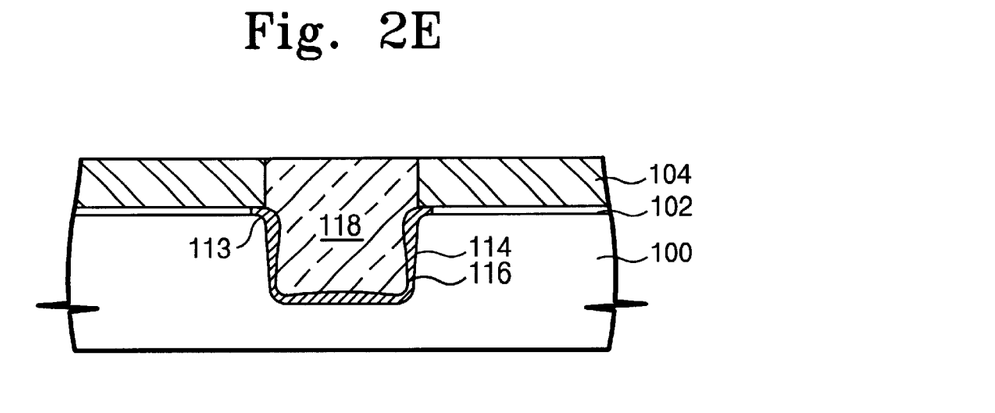

As shown in FIG. 2E, the PE-TEOS layer 120, the oxide layer 118, and the HTO layer 106 are subjected to CMP process until a part of the thickness of the nitride layer 104 is exposed.

Figure 2F:
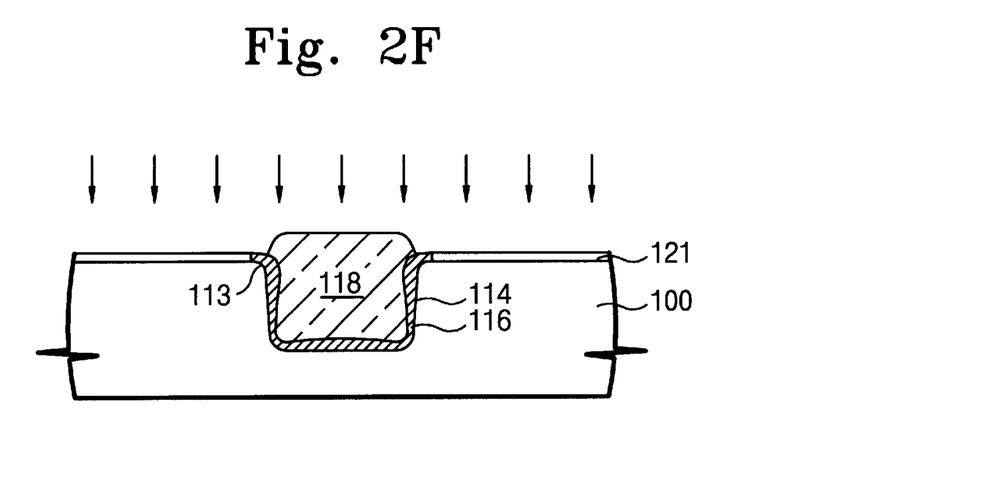

Then, as shown in FIG. 2F, the nitride layer 104 and the pad oxide layer 102 are sequentially removed by wet or dry etching. A patterned masking oxide layer 121 is then formed over the substrate 100 at the sides of the isolation trench. The substrate 100 is then subjected to ion implantation according to the parameters of the patterned masking oxide layer 121 to generate a well region, field region, and channel stop region.

Figure 2G:
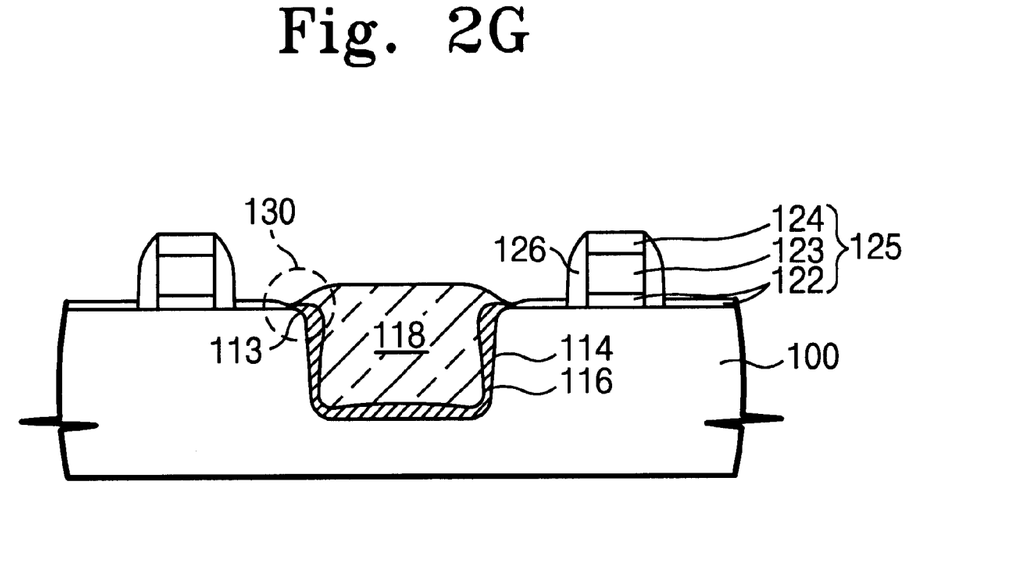
Figure 2G:
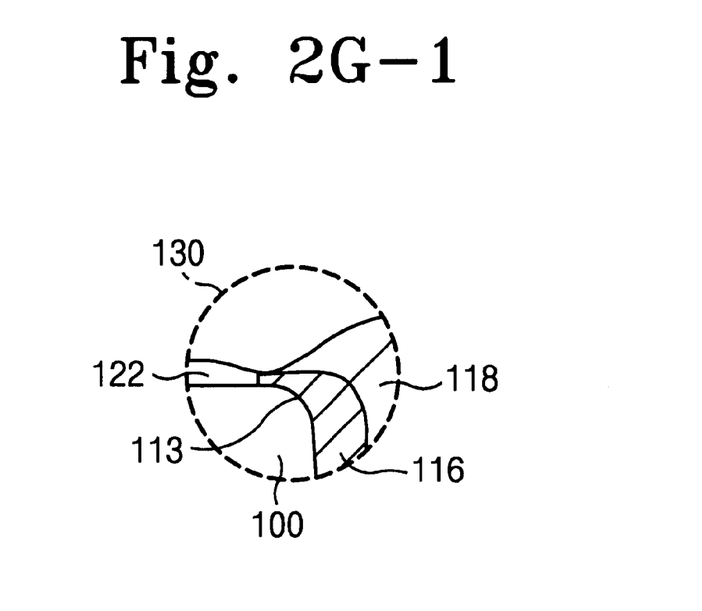

As shown in FIG. 2G, after removing the patterned masking oxide layer 121, a gate oxide layer 122, a conductive layer 123, and a nitride layer 124 are sequentially deposited over the substrate 100 including the isolation trench. The conductive layer 123 may comprise a polysilicon layer and a silicide layer.

A gate electrode patterned masking layer (not shown) is used to form a gate electrode 125 by sequentially etching the nitride layer 124, the conductive layer 123, and the gate oxide layer 122. A nitride layer (not shown) is deposited over the substrate 100 and the gate electrode 125. The nitride layer is anisotropically etched back to form insulating spacers 126 on the side walls of the gate electrode.

The rounded edges 113 of the trench 114 prevent a gate oxide thinning phenomenon from occurring, such as the phenomenon shown in FIG. 1E. In particular, as a result of this rounding of the edge 113 of the trench 114, the active region of the substrate 100 at its top edge is isolated from the oxide layer 118 in the trench 114 by the thermal oxide layer 116 and the gate oxide layer 122. This is clearly shown by area 130 in FIG. 2G. By ensuring that the substrate 100 and oxide layer 118 are isolated, the formation of a parasitic transistor can be avoided and deterioration of the threshold voltage of the element can be avoided.

The present invention provides isolation trenches that can avoid the creation of a parasitic transistor at top edges of the isolation trench by undercutting the pad oxide layer and rounding the top edges of the active region.

While the present invention has been described in connection with specific embodiments accompanied by the attached drawings, it will be readily appreciated by those skilled in the art that various changes and modifications may be made thereto without departing the gist of the present invention.

What is claimed is:

1. A method of forming an isolation trench in a semiconductor substrate, comprising:

forming a first insulating layer over the substrate;

forming a second insulating layer over the first insulating layer;

etching the first and second insulating layers to define active and non-active regions according to a patterned masking photoresist layer;

etching a first portion of the substrate in the non-active region;

undercutting the first insulating layer in the active region to expose second portions of the substrate in the active region after etching the first portion of the substrate in the non-active region;

etching the substrate using the second insulating layer as a masking layer to form a trench in which exposed edges of the substrate are rounded;

forming a third insulating layer on the bottom and side walls of the trench and over the rounded edges of the substrate; and etching the second insulating layer to expose the first insulating layer.

2. A method of forming an isolation trench in a semiconductor substrate, as recited in claim 1, further comprising removing the first insulating layer.

3. A method of forming an isolation trench in a semiconductor substrate, as recited in claim 1, wherein the first insulating layer is an oxide layer having a thickness of about 70 Å to 240 Å.

4. A method of forming an isolation trench in a semiconductor substrate, as recited in claim 1, wherein the third insulating layers is an oxide layer having a thickness of about 100 Å to 500 Å.

5. A method of forming an isolation trench in a semiconductor substrate, as recited in claim 1, wherein the second insulating layer comprises a silicon nitride layer and a high temperature oxidation (HTO) layer.

6. A method of forming an isolation trench in a semiconductor substrate, as recited in claim 5, wherein the second insulating layer is about 1500 Å thick and the high temperature oxidation layer is about 500 Å thick.

7. A method of forming an isolation trench in a semiconductor substrate, as recited in claim 1, further comprising depositing an anti-reflective coating (ARC) over the second insulating layer.

8. A method of forming an isolation trench in a semiconductor substrate, as recited in claim 7, wherein the anti-reflective coating has a thickness of about 600 Å.

9. A method of forming an isolation trench in a semiconductor substrate, as recited in claim 1, wherein the first portion of the substrate is etched to a thickness in the range of about 200 Å to 500 Å.

10. A method of forming an isolation trench in a semiconductor substrate, as recited in claim 1, wherein the amount undercut of the first insulating layer is about 100 Å to 300 Å.

* * * * *